United States Patent
Lee

(10) Patent No.: US 7,652,940 B2
(45) Date of Patent: Jan. 26, 2010

(54) COLUMN ACCESS CONTROL APPARATUS HAVING FAST COLUMN ACCESS SPEED AT READ OPERATION

(75) Inventor: Yin Jae Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 43 days.

(21) Appl. No.: 12/001,300

(22) Filed: Dec. 10, 2007

(65) Prior Publication Data

US 2009/0003095 A1 Jan. 1, 2009

(30) Foreign Application Priority Data

Jun. 27, 2007 (KR) .................. 10-2007-0063934

(51) Int. Cl.
*G11C 7/00* (2006.01)

(52) U.S. Cl. ...................... 365/194; 365/193
(58) Field of Classification Search ............... 365/194, 365/193
See application file for complete search history.

(56) References Cited

U.S. PATENT DOCUMENTS

| 6,108,248 | A | 8/2000 | Oh |
| 6,279,071 | B1 | 8/2001 | Walker et al. |
| 6,301,189 | B1 * | 10/2001 | Bae ................ 365/233.14 |
| 7,295,488 | B2 | 11/2007 | Hwang et al. |

FOREIGN PATENT DOCUMENTS

KR 10-2006-0067236 A 6/2006

* cited by examiner

*Primary Examiner*—Amir Zarabian
*Assistant Examiner*—Jason Lappas
(74) *Attorney, Agent, or Firm*—John P. White; Cooper & Dunham LLP

(57) ABSTRACT

A column access control apparatus comprises a column signal control unit for controlling a write CAS pulse signal and an internal CAS pulse signal in response to a first signal, and a column decoder for outputting a column decoding signal using an output signal of the column signal control unit and the first signal. The column signal control unit delays the internal CAS pulse signal and the write CAS pulse signal to output delayed signals when the first signal is activated.

13 Claims, 5 Drawing Sheets

COLUMN ACCESS CONTROL APPARATUS HAVING FAST COLUMN ACCESS SPEED AT READ OPERATION

BACKGROUND

The present disclosure relates to a semiconductor memory device and, more particularly, to a column access control apparatus.

Generally, an access time of a column access operation in a read operation is the same as that in a write operation in a DRAM.

In case of error checking and correction (ECC), column access operation is performed based on a delay which is caused by an external data transfer through an internal path in the write operation. However, since an additional delay is further required for a decision in an ECC operation, the column access operation takes longer time than usual.

FIG. 1 is a block diagram of a conventional column access control apparatus, and FIG. 2 is a circuit diagram of a column access control unit of FIG. 1.

As shown in FIG. 1, the conventional column access control apparatus includes a column address counter 100, a column access control unit 200, a column decoder 300 and a memory cell array 400.

Here, a signal CASP_WT is used to generate a column access signal YI in the write operation and a signal CASP_RD is also used to generate the column access signal YI in the read operation. An internal CAS pulse signal ICASP is used to generate the column access signal YI in a burst operation.

A signal AYP is employed to generate the column access signal YI together with an address signal YAT. The signal AYP is activated if any one of the three signals CASP_WT, CASP_RD and ICASP is activated.

A signal BURST_STOP stops the generation of the column access signal YI during the burst operation. As shown in FIG. 2, when the signal BURST_STOP is activated, the signal AYP is in a low level. Thus, the column access signal YI is in a low level.

Meanwhile, in case of the ECC operation, the column access operation in the column access control apparatus should be performed based on the delay caused by the external data transfer through the internal path in the write operation. However, since an additional delay is further required to take time for a decision in an ECC operation, there is a problem that the column access operation takes longer time than usual.

BRIEF SUMMARY

According to an aspect of the present disclosure, there is provided a column access control apparatus comprising a column signal control unit for controlling a write CAS pulse signal and an internal CAS pulse signal, in response to a first signal, and a column decoder for outputting a column decoding signal using an output signal of the column signal control unit and the first signal.

According to another aspect of the present disclosure, there is provided a column access control apparatus comprising a column signal control unit for controlling a write CAS pulse signal and an internal CAS pulse signal, in response to a first signal, a column address counter for generating a column address signal using the write CAS pulse signal and the internal CAS pulse signal outputted from the column signal control unit, a column access control unit for generating a control signal in response to the first signal, and a column decoder for outputting a column decoding signal using the control signal and the column address signal.

BRIEF DESCRIPTION OF THE DRAWINGS

The above and other features of the subject matter of the present disclosure will be more apparent from the following detailed description taken in conjunction with the accompanying drawings, in which.

DETAILED DESCRIPTION OF EXEMPLARY EMBODIMENTS

First, in order to improve the operational speed of a memory device which applies an ECC operation, in the present invention, a column access speed in a read operation is made faster than that in a write operation, an address for a column access in the read operation is made different from that in the write operation according to the speed of a column access operation, and a signal generated during a burst stop operation in the read operation is made different from that in the write operation.

Figure 1:
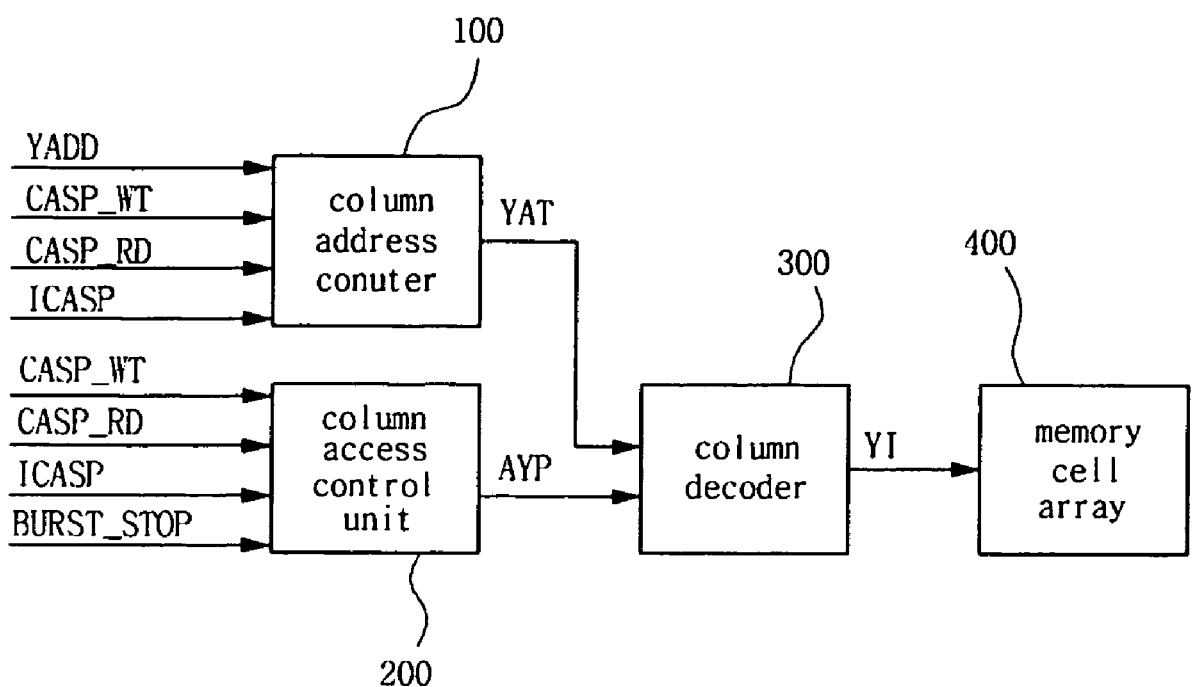
FIG. 1 is a block diagram of a conventional column access control apparatus.
Figure 2:
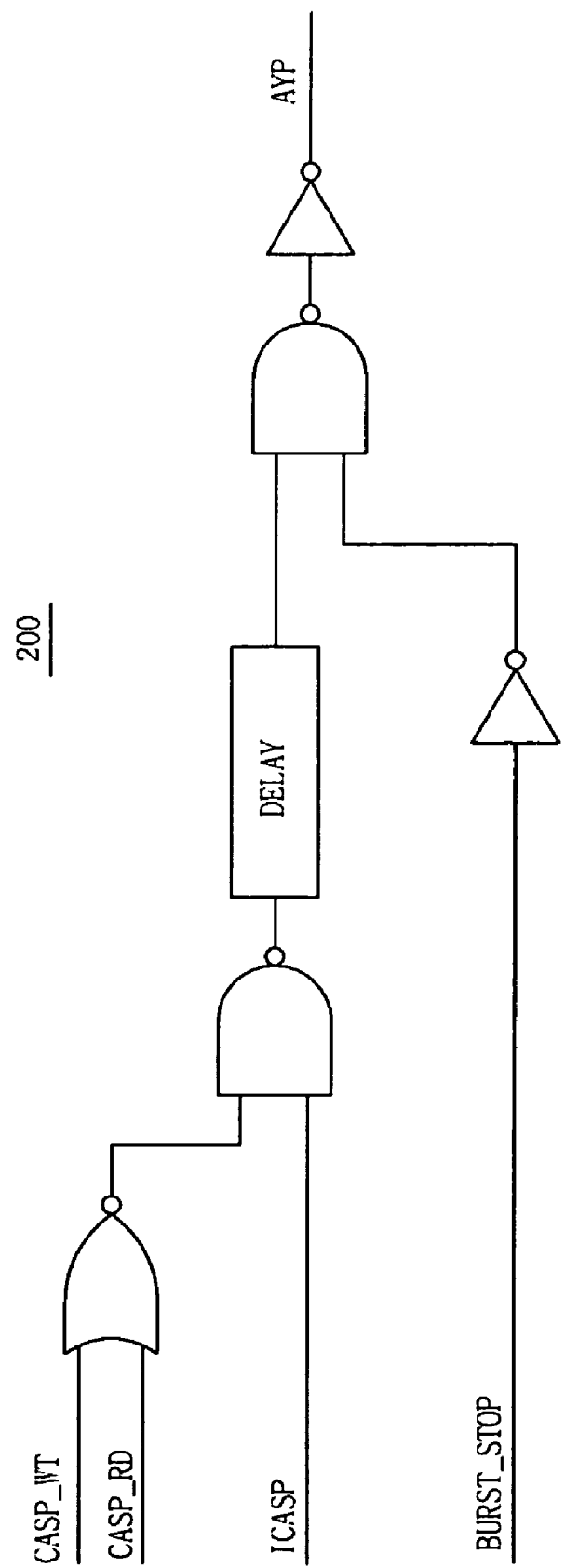
FIG. 2 is a circuit diagram of a column access control unit of FIG. 1.
Figure 3:
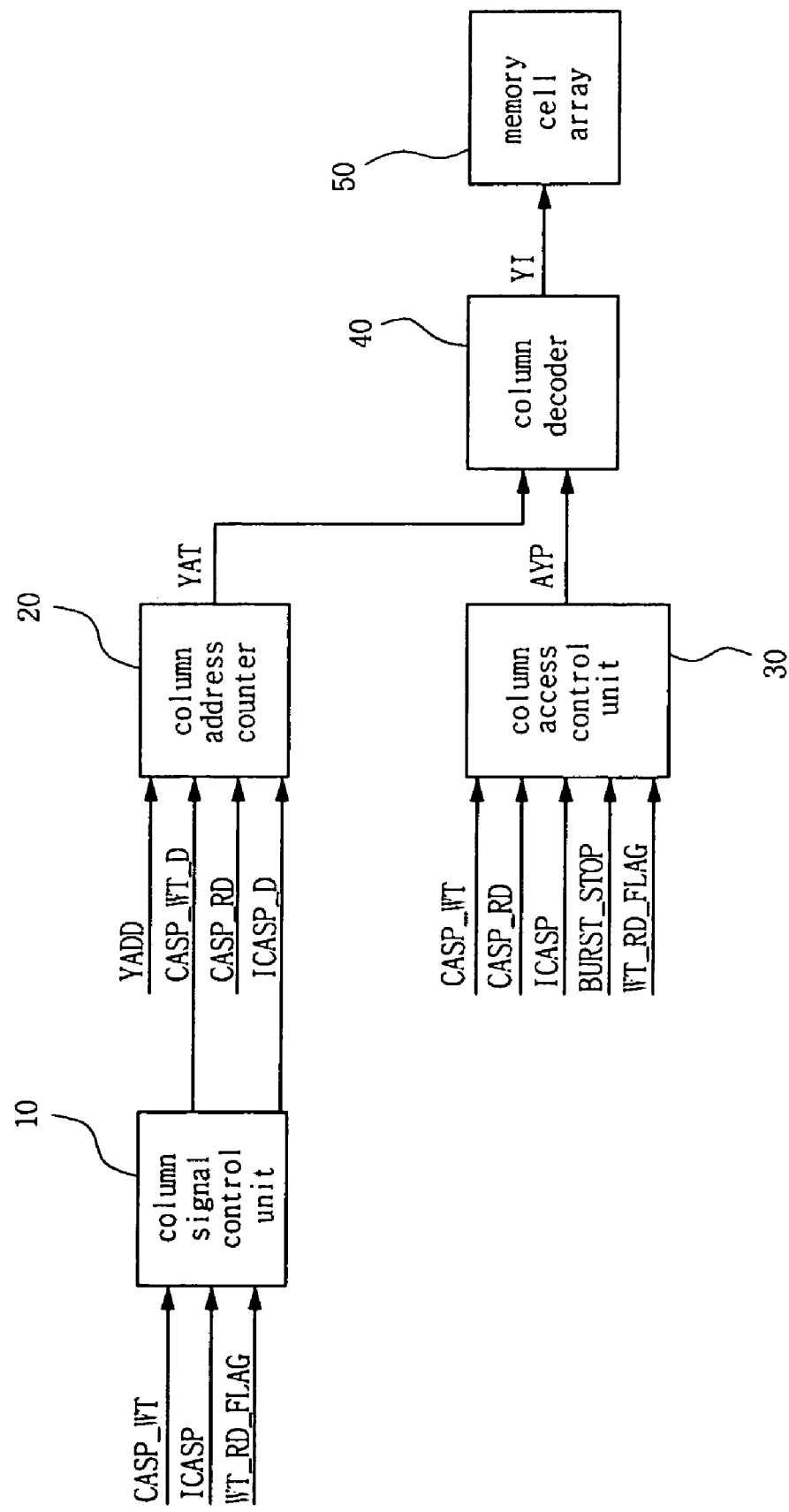
FIG. 3 is a block diagram of a column access control apparatus according to an exemplary embodiment of the present invention.

As shown in FIG. 3, a column access control apparatus, in accordance with an exemplary embodiment of the present invention, includes a column signal control unit 10 for controlling a write CAS pulse signal CASP_WT and an internal CAS pulse signal ICASP in response to a write/read flag signal WT_RD_FLAG which is activated in the write operation and a column address counter 20 for generating a column address signal YAT using the write CAS pulse signal CASP_WT, the internal CAS pulse signal ICASP, a read CAS pulse signal CASP_RD and an internal column address signal YADD.

The column access control apparatus also includes a column access control unit 30 for generating a control signal AYP using the write CAS pulse signal CASP_WT, the read CAS pulse signal CASP_RD, the internal CAS pulse signal ICASP, a burst stop signal BURST_STOP, and the write/read flag signal WT_RD_FLAG, and a column decoder 40 for generating a column decoding signal YI using the control signal AYP and the column address signal YAT and outputting it to a memory cell array 50.

Figure 4:
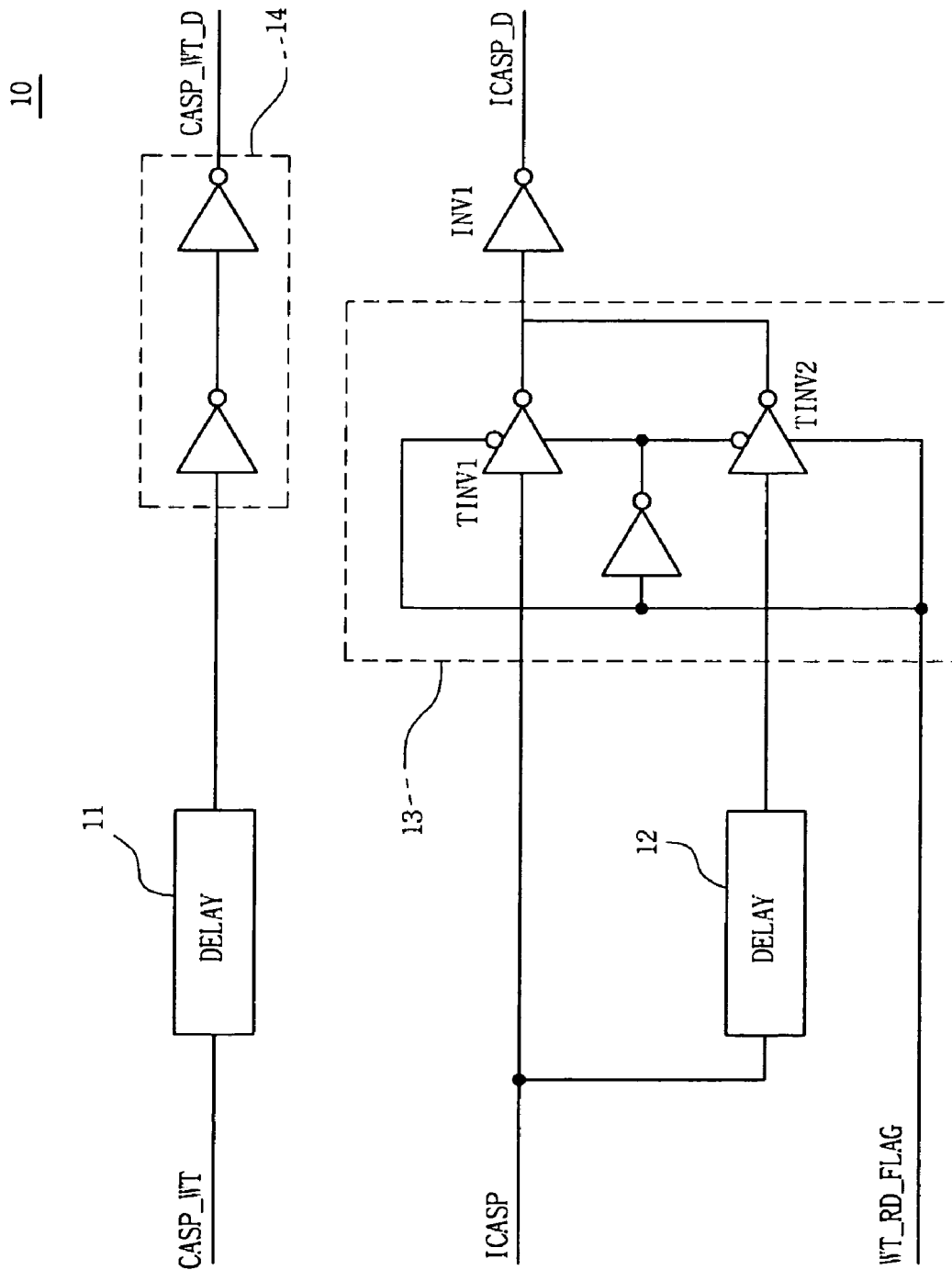
FIG. 4 is a circuit diagram of a column signal control unit in the column access control apparatus of FIG. 3.

As shown in FIG. 4, the column signal control unit 10 includes a first delayer 11 for delaying the write CAS pulse signal CASP_WT for a predetermined section and outputting it, a second delayer 12 for delaying the internal CAS pulse signal ICASP for a predetermined section and outputting it, and a signal transferring unit 13 for transferring the internal CAS pulse signal ICASP in response to the write/read flag signal WT_RD_FLAG which is activated in the write operation, or transferring an output signal of the second delayer 12.

Here, the column signal control unit 10 further includes a first buffer 14 for buffering an output signal of the first delayer 11 and a first inverter INV1 for buffering an output signal of the signal transferring unit 13.

Figure 5:
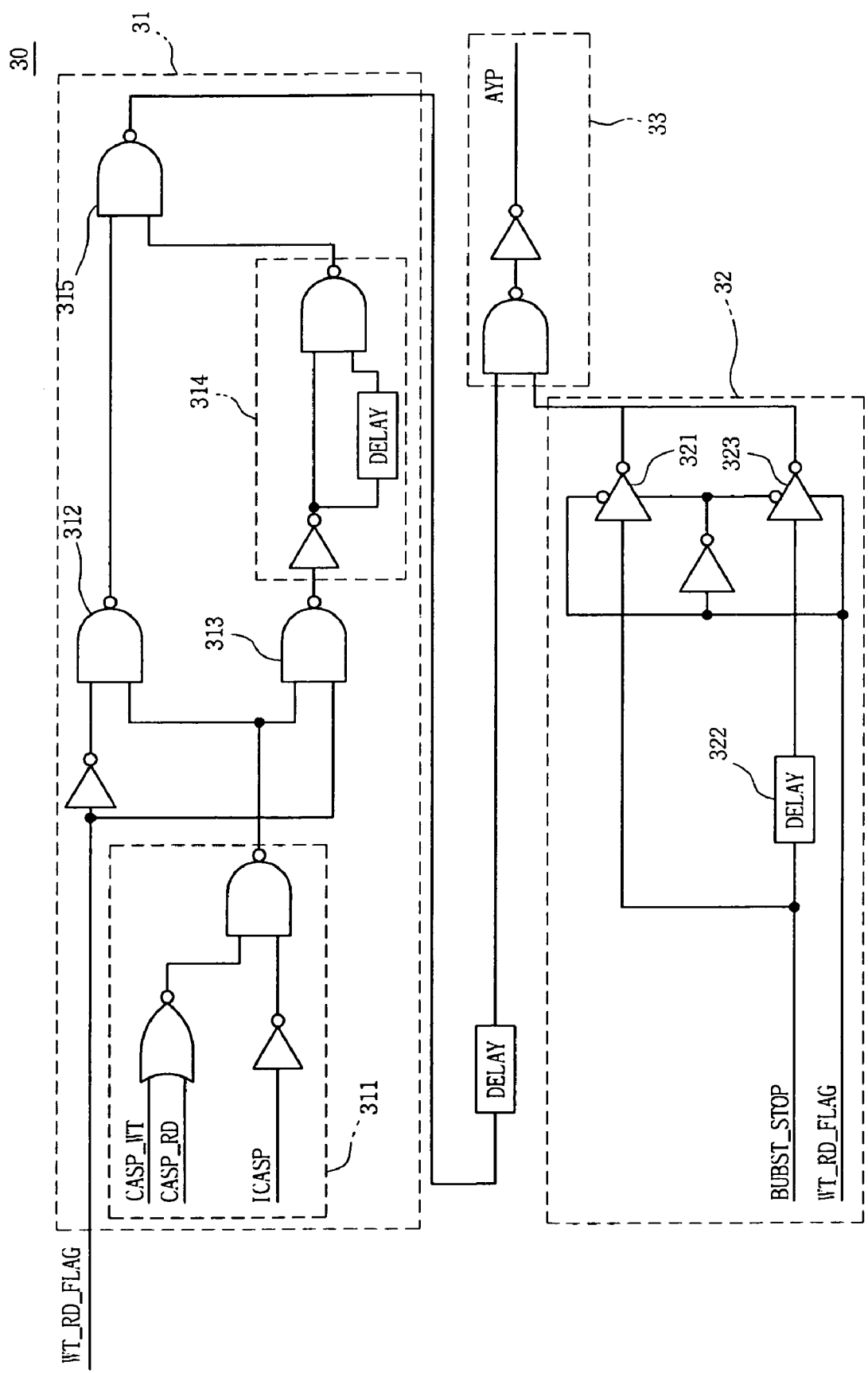
FIG. 5 is a circuit diagram of a column access control unit in the column access control apparatus of FIG. 3.

As shown in FIG. 5, the column access control unit 30 includes a first operation unit 31 for performing a logic operation to the write CAS pulse signal CASP_WT, the read CAS pulse signal CASP_RD and the internal CAS pulse signal ICASP in response to the write/read flag signal WT_RD_FLAG, a signal transferring unit 32 for transferring the burst stop signal BURST_STOP in response to the write/read flag signal WT_RD_FLAG, and a second operation unit 33 for performing a logic operation to an output signal of the first operation unit 31 and an output signal of the signal transferring unit 32.

The first operation unit 31 includes a first logic unit 311 which performs a NAND operation to the write CAS pulse signal CASP_WT, the read CAS pulse signal CASP_RD and the internal CAS pulse signal ICASP, a second logic unit 312 which performs a NAND operation to an output signal of the first logic unit 311 and an inverted signal of the write/read flag signal WT_RD_FLAG, a third logic unit 313 which performs a NAND operation to the output signal of the first logic unit 311 and the write/read flag signal WT_RD_FLAG, a delayer 314 which delays an output signal of the third logic unit 313 and outputs it, and a fourth logic unit 315 which performs a NAND operation to an output signal of the second logic unit 312 and an output signal of the delayer 314.

The signal transferring unit 32 includes a first transmitter 321 which transmits the burst stop signal BURST_STOP in response to the write/read flag signal WT_RD_FLAG, a delayer 322 which delays the burst stop signal BURST_STOP, and a second transmitter 323 which transmits an output signal of the delayer 322 in response to the write/read flag signal WT_RD_FLAG.

The operation of the column access control apparatus will be described below.

First, the write CAS pulse signal CASP_WT is used to generate the column decoding signal YI in the write operation and the read CAS pulse signal CASP_RD is used to generate the column access signal YI in the read operation. The internal CAS pulse signal ICASP is used to generate the column decoding signal YI in a burst operation. The control signal AYP is used to generate the column decoding signal YI together with the column address signal YAT of the column address counter 20. The burst stop signal BURST_STOP stops the generation of the column decoding signal YI when it is activated during the burst operation. The burst stop signal BURST_STOP is activated when it is interrupted for a refresh during the burst write operation.

Regarding the signals CASP_WT, ICASP, AYP and BURST_STOP, a delay occurs in response to the write/read flag signal WT_RD_FLAG which is activated in the write operation.

As shown in FIG. 4, in the column signal control unit 10, the write/read flag signal WT_RD_FLAG maintains a low level in the read operation so that a first tristate gate TINV1 is enabled to form a signal path and a second tristate gate TINV2 is disabled to be blocked. Thus, the internal CAS pulse signal ICASP passes through the first tristate gate TINV1 and the first inverter INV1 to generate a signal ICASP_D.

In the write operation, the write/read flag signal WT_RD_FLAG is in a high level so that the first tristate gate TINV1 is disabled and the second tristate gate TINV2 forms a path. Thus, the internal CAS pulse signal ICASP passes through a delayer 12, the second tristate gate TINV2 and the first inverter INV1 to generate the signal ICASP_D.

The signal ICASP_D, which is delayed in the write operation, passes through the column address counter 20 so that the column address signal YAT is delayed. The signal CASP_WT passes through a delayer 11 to be delayed and then outputted.

As shown in FIG. 5, in the column access control unit 30, the write/read flag signal WT_RD_FLAG maintains a high level in the read operation so that NAND gate 312 is enabled to form a path and NAND gate 3 313 is disabled to be blocked. Thus, the signal CASP passes through the NAND gate 312 and NAND gate 315 to generate the control signal AYP.

Meanwhile, in the write operation, the write/read flag signal WT_RD_FLAG is in a high level so that the NAND gate 312 is disabled and NAND gate 313 forms a path. Thus, the signal CASP passes through the delayer 314 and the NAND gate 315 to generate the control signal AYP.

The control signal AYP, which is delayed in the write operation, delays the column decoding signal YI. Thus, the column decoding signal YI is generated faster in the read operation and it is generated slower in the write operation.

As shown in FIG. 5, in the column access control unit 30, the write/read flag signal WT_RD_FLAG maintains a low level in the read operation so that TINV1 321, which is a tristate gate, is enabled to form a path and TINV2 323 is disabled to be blocked. Thus, the signal BURST_STOP passes through TINV1 321 to generate a signal BURST_STOP_D.

Meanwhile, the write/read flag signal WT_RD_FLAG is in a high level in the write operation so that TINV1 321 is disabled and TINV2 323 forms a path. Thus, the signal BURST_STOP passes through the delayer 322 and TINV2 323 to generate the signal BURST_STOP_D.

Therefore, the signal BURST_STOP_D, which is delayed in the write operation, stops the generation of the control signal AYP to block the column decoding signal YI. The purpose of delaying the signal BURST_STOP in the write operation is to stop the distortion of the control signal AYP which is generated in the former cycle because of the improvement of a clock speed.

Accordingly, in the present invention, the column access speed in the read operation is made faster than that in the write operation, the address for the column access in the read operation is made different from that in the write operation according to the speed of the column access operation, and the signal generated during the burst stop operation in the read operation is made different from that in the write operation in order to improve the operational speed of the memory device which applies the ECC operation so that the signal generated in the former cycle is prevented from being blocked.

Although examples and exemplary embodiments of the present invention have been described for illustrative purposes, those skilled in the art will appreciate that various modifications, additions and substitutions are possible, without departing from the scope and spirit of the present disclosure and the accompanying claims.

The present application claims priority to Korean application number 10-2007-63934, filed on Jun. 27, 2007, the entire contents of which are incorporated herein by reference.

What is claimed is:

1. A column access control apparatus comprising:
   a first delayer for delaying a write CAS pulse signal and outputting a delayed write CAS pulse signal;
   a second delayer for delaying an internal CAS pulse signal and outputting a delayed internal CAS pulse signal;
   a first signal transferring unit for transferring the internal CAS pulse signal in response to a first signal, or transferring the delayed internal CAS pulse signal from the second delayer;
   and
   a column decoder for outputting a column decoding signal using an output signal of the first signal transferring unit, the delayed write CAS pulse signal and the first signal.

2. The apparatus of claim 1, wherein the first signal has a logic level for a write operation.

3. The apparatus of claim 1, further includes:
   a first buffer for buffering the delayed write CAS pulse signal from the first delayer; and
   a second buffer for buffering an output signal of the signal transferring unit.

4. The apparatus of claim 1, wherein the column decoder includes:
   a column address counter for generating a column address signal using the delayed write CAS pulse signal and the output signal of the first signal transferring unit;
   a column access control unit for generating a control signal in response to the first signal; and
   a column decoding signal generator for generating the column decoding signal using the control signal and the column address signal.

5. The apparatus of claim 4, wherein the control signal is activated when the write CAS pulse signal or a read CAS pulse signal or the internal CAS pulse signal is activated, wherein the control signal is delayed and outputted when the first signal is activated.

6. The apparatus of claim 4, wherein the column access control unit includes:
   a first operation unit for performing a first logic operation on the write CAS pulse signal, the read CAS pulse signal and the internal CAS pulse signal, in response to the first signal;
   a second signal transferring unit for transferring a burst stop signal in response to the first signal; and
   a second operation unit for performing a second logic operation using a first output signal of the first operation unit and a second output signal of the signal transferring unit.

7. The apparatus of claim 6, wherein the first operation unit includes:
   a first logic unit for performing a NAND operation on the write CAS pulse signal, the read CAS pulse signal and the internal CAS pulse signal;
   a second logic unit for performing a NAND operation on a third output signal of the first logic unit and an inverted signal of the first signal;
   a third logic unit for performing a NAND operation on a fourth output signal of the first logic unit and the first signal;
   a third delayer for delaying a fifth output signal of the third logic unit and outputting a delayed signal; and
   a fourth logic unit for performing a NAND operation on a sixth output signal of the second logic unit and the delayed signal of the third delayer.

8. The apparatus of claim 6, wherein the second signal transferring unit includes:
   a first transmitter for transmitting the burst stop signal in response to the first signal;
   a third delayer for delaying the burst stop signal to generate a delayed signal; and
   a second transmitter for transmitting the delayed signal of the third delayer in response to the first signal.

9. A column access control apparatus comprising:
   a column signal control unit for delaying a write CAS pulse signal to generate a delayed write CAS pulse signal, and delaying an internal CAS pulse signal in response to a first signal to generate a delayed internal CAS pulse signal;
   a column address counter for generating a column address signal using the delayed write CAS pulse signal and the delayed internal CAS pulse signal outputted from the column signal control unit;
   a column access control unit configured to receive the write CAS pulse signal, a read CAS pulse signal, the internal CAS pulse signal and a burst stop signal and generate a control signal in response to the first signal; and
   a column decoder for outputting a column decoding signal using the control signal and the column address signal.

10. The apparatus of claim 9, wherein the first signal has a logic level for a write operation.

11. The apparatus of claim 9, wherein the control signal is activated when the write CAS pulse signal or a read CAS pulse signal or the internal CAS pulse signal is activated, and the control signal is delayed and outputted when the first signal is activated.

12. The apparatus of claim 9, wherein the column signal control unit includes:
   a first delayer for delaying the write CAS pulse signal and outputting the delayed write CAS pulse signal;
   a second delayer for delaying the internal CAS pulse signal; and
   a signal transferring unit for transferring the internal CAS pulse signal in response to the first signal or transferring the delayed internal CAS pulse signal of the second delayer to generate the delayed internal CAS pulse signal.

13. The apparatus of claim 12, wherein the column signal control unit further includes:
   a first buffer for buffering the delayed write CAS pulse signal of the first delayer; and
   a second buffer for buffering the delayed internal CAS pulse signal.

* * * * *